United States Patent
Yamazaki et al.

(10) Patent No.: US 8,207,024 B2
(45) Date of Patent: Jun. 26, 2012

(54) DISPLAY DEVICE

(75) Inventors: Shunpei Yamazaki, Tokyo (JP); Yasuyuki Arai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/696,610

(22) Filed: Jan. 29, 2010

(65) Prior Publication Data

US 2010/0151634 A1    Jun. 17, 2010

Related U.S. Application Data

(63) Continuation of application No. 10/243,680, filed on Sep. 16, 2002, now abandoned.

(30) Foreign Application Priority Data

Sep. 18, 2001    (JP) .................................. 2001-282768

(51) Int. Cl.
    *H01L 21/00*    (2006.01)
    *H01L 21/84*    (2006.01)
(52) U.S. Cl. .......... 438/150; 438/28; 438/149; 438/155; 257/E21.134
(58) Field of Classification Search .............. 438/28–30, 438/149–160; 257/E21.134
    See application file for complete search history.

(56) References Cited

U.S. PATENT DOCUMENTS

| | | |
|---|---|---|
| 5,173,792 A | 12/1992 | Matsueda |
| 5,529,951 A | 6/1996 | Noguchi et al. |
| 5,684,365 A | 11/1997 | Tang et al. |
| 5,789,763 A | 8/1998 | Kato et al. |
| 5,942,856 A | 8/1999 | Koyama |
| 5,943,593 A | 8/1999 | Noguchi et al. |
| 5,960,323 A | 9/1999 | Wakita et al. |
| 5,981,974 A | 11/1999 | Makita |
| 6,355,940 B1 | 3/2002 | Koga et al. |
| 6,501,448 B1 | 12/2002 | Komiya et al. |
| 6,709,905 B2 | 3/2004 | Kusumoto et al. |
| 6,723,590 B1 | 4/2004 | Zhang et al. |
| 2001/0009283 A1* | 7/2001 | Arao et al. ..................... 257/303 |
| 2001/0024187 A1 | 9/2001 | Sato et al. |
| 2001/0052598 A1 | 12/2001 | Koga et al. |

FOREIGN PATENT DOCUMENTS

| | | |
|---|---|---|
| JP | 8-234683 A | 9/1996 |
| JP | 11084418 A | 3/1999 |
| JP | 2000-221903 A | 8/2000 |

* cited by examiner

*Primary Examiner* — Shouxiang Hu

(74) *Attorney, Agent, or Firm* — Fish & Richardson P.C.

(57) ABSTRACT

At least two TFTs which are connected with a light emitting element are provided, crystallinities of semiconductor regions composing active layers of the respective TFTs are made different from each other. As the semiconductor region, a region obtained by crystallizing an amorphous semiconductor film by laser annealing is applied. In order to change the crystallinity, a method of changing a scan direction of a continuous oscillating laser beam so that crystal growth directions are made different from each other is applied. Alternatively, a method of changing a channel length direction of TFT between the respective semiconductor regions without changing the scan direction of the continuous oscillating laser beam so that a crystal growth direction and a current flowing direction are different from each other is applied.

14 Claims, 14 Drawing Sheets

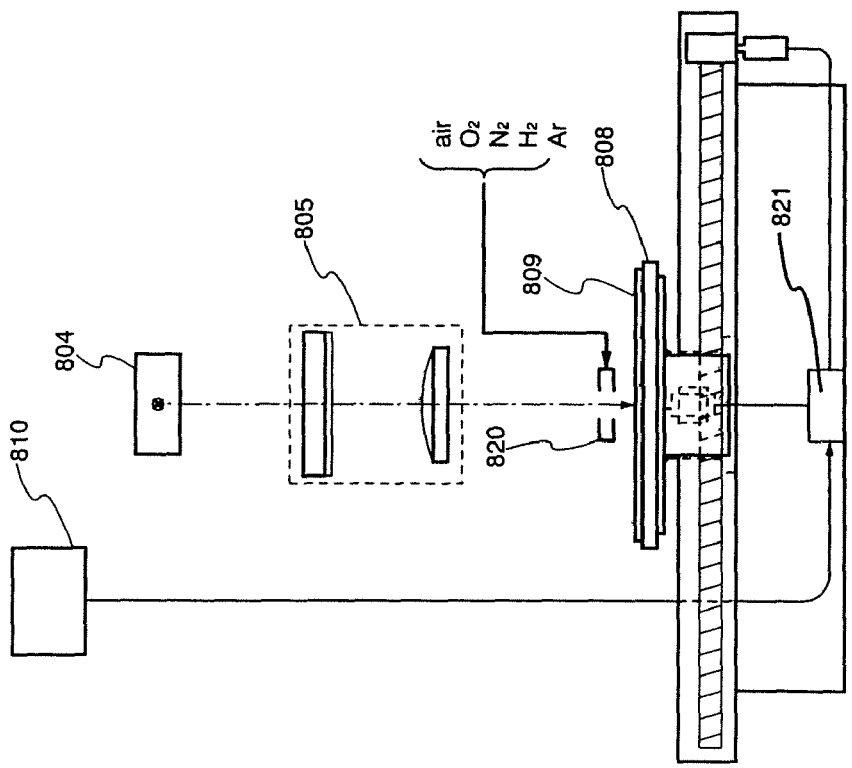
FIG. 10B side view
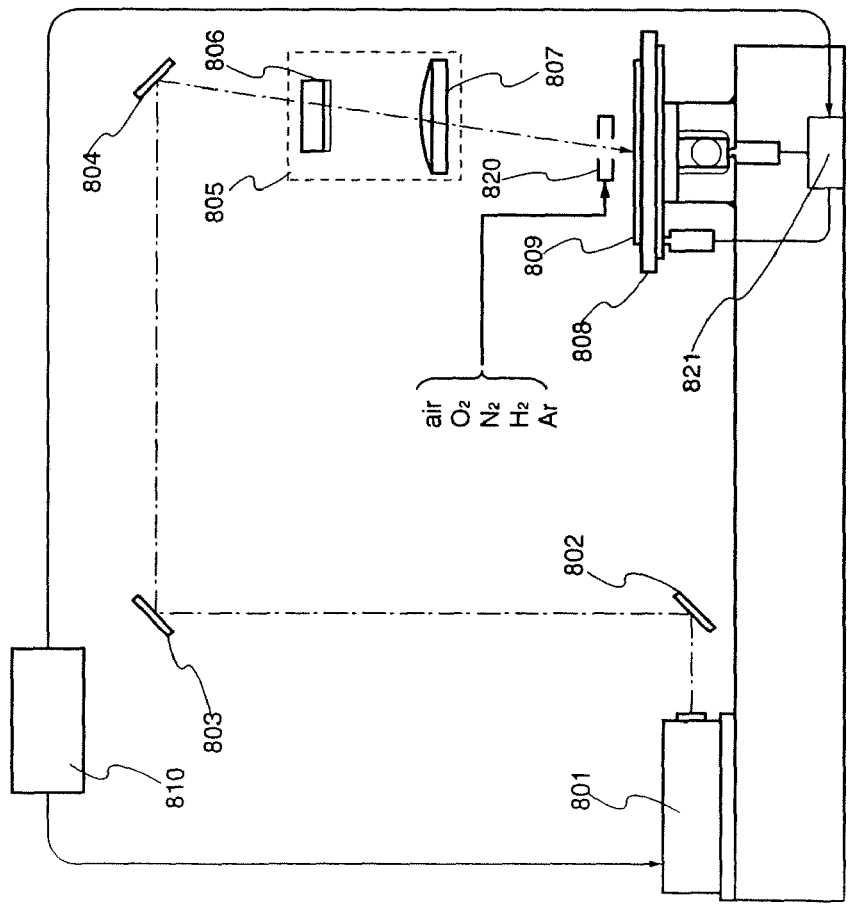
FIG. 10A front view

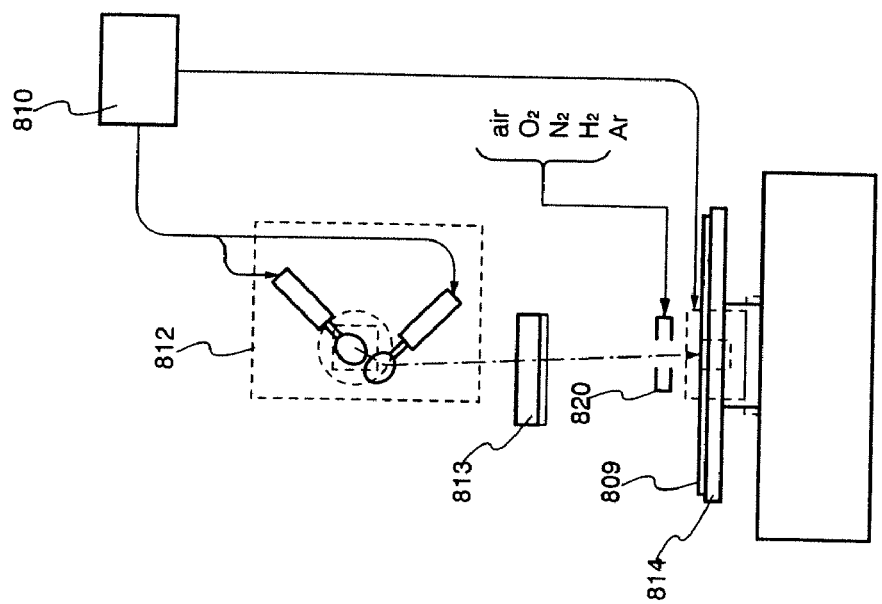
FIG. 11B side view
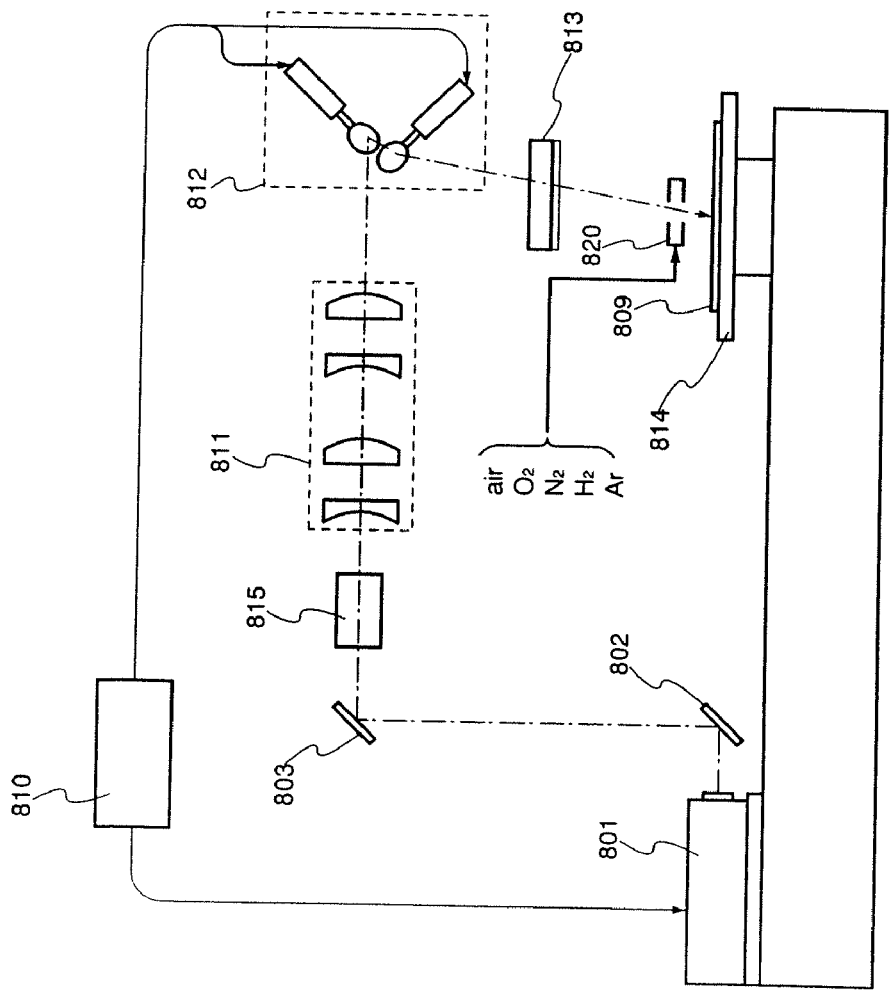
FIG. 11A front view

DISPLAY DEVICE

CROSS-REFERENCE TO RELATED APPLICATIONS

This application is a continuation of U.S. application Ser. No. 10/243,680, filed Sep. 16, 2002, now pending, which claims the benefit of a foreign priority application filed in Japan as Serial No. 2001-282768 on Sep. 18, 2001, both of which are incorporated by reference.

BACKGROUND OF THE INVENTION

1. Field of the Invention

The present invention relates to a display device including a light emitting element in which fluorescence or phosphorescence is obtained, and more particularly to a display device in which an active element such as an insulated gate transistor or a thin film transistor and a light emitting element connected therewith are provided to each pixel. Of course, it is possible to apply the present invention in a liquid crystal display device.

2. Description of the Related Art

According to an active matrix display device, a plurality of pixels are arranged in matrix, and a light intensity of each of the pixel based on a video signal is controlled by an active element provided to each of the pixels, thereby displaying a video image. A typical example of the active element is a thin film transistor (hereinafter referred to as a TFT). Currently, a structure using a liquid crystal which responds to a voltage is widely used as means for controlling a light intensity by a voltage written into each of the pixels. In addition, a method of providing a light emitting element to each of the pixels and controlling a light intensity by a current flowing into the light emitting element to display a video image is also known as another structure.

In recent years, one of the most significant light emitting elements is one to which is an organic compound is applied as a phosphor, and also called an organic electroluminescence element because electroluminescence is utilized. Various organic compound materials having light emitting property are known. It is also known that the light emitting mechanism includes fluorescence in which light is emitted through a singlet excitation state and phosphorescence in which light is emitted through a triplet excitation state.

FIG. 12 shows an example indicating a structure of a pixel in a display device. Such a structure of the pixel is disclosed in JP 08-234683 or the like. The pixel shown in FIG. 12 is composed of TFTs 50 and 51, a storage capacitor 52, and a light emitting element 53. With respect to the TFT 50, the gate is connected with a scan line 55, the source is connected with a signal line 54, and the drain is connected with the gate of the TFT 51. With respect to the TFT 51, the source is connected with a power source line 56 and the drain is connected with one terminal of the light emitting element 53. The other terminal of the light emitting element 53 is connected with a power source 57. The storage capacitor 52 is provided so as to keep a voltage between the gate and the source of the TFT 51.

With respect to the operation of the pixel, when the TFT 50 is turned on by a voltage of the scan line 55, a video signal inputted to the signal line 54 is applied to the gate of the TFT 51. When the video signal is inputted, a gate voltage (a voltage difference between the gate and the source) of the TFT 51 is determined according to the voltage of the inputted video signal. Then, a drain current of the TFT 51 which is made to flow by the gate voltage is supplied to the light emitting element 53. The light emitting element 53 emits light according to a value of the supplied current. Light emission by the light emitting element is maintained until a next video signal is inputted. Thus, when such operation is conducted over all pixels in every specific period, a still image and a moving image can be displayed. In addition, when materials for emitting light of each color, red, green, and blue, are applied to phosphors of the light emitting element and the pixels using these materials are arranged, color display can be conducted.

Also, a structure in which TFTs are connected in parallel with an electroluminescence element is disclosed in JP 2000-221903. According to the publication, a plurality of TFTs are connected in parallel with the electroluminescence element. Thus, even if there is a variation in characteristics of TFTs, a variation in light emitting brightness is not caused and uniform display can be obtained.

In order to flow a current into a light emitting element and drive it, a high current drive capacity is required for a TFT. To satisfy this, it is considered to be desirable that an active region of the TFT is made from a polycrystalline silicon film. As a method of forming a polycrystalline silicon film on an insulating surface, there is a method of depositing an amorphous silicon film by plasma CVD method or the like and crystallizing it by a laser beam irradiation. This is called laser annealing. Characteristics thereof include that, even if a glass substrate having a low heat resistance in which a distortion point is 700° C. or lower is used, only a silicon film can be selectively heated to be crystallized without heating the substrate to a large extent. As a laser, a gas laser such as an excimer laser or a solid laser such as a YAG laser and a YVO$_4$ laser is used.

However, with respect to the polycrystalline silicon film produced by the laser annealing, there are variations in size and orientation of a crystal grain. In addition to this, sufficient crystallization is not conducted so that there is a region in which crystallinity is insufficient. When a size of a channel formation region is decreased or a crystal grain is enlarged so that the number of grain boundaries present in a channel is reduced, there is a problem in that a variation in characteristics of TFTs conversely becomes larger. With respect to the pixel shown in FIG. 12, when characteristics of the TFT 51 such as a threshold voltage and an on current are varied for every pixel, even if video signals have the same potential, an amount of a drain current of the TFT 51 varies between pixels. Thus, a variation in brightness of the light emitting element 53 is caused.

Specifically, when display with 64-gray scales is conducted, it is required that a variation of an on current value of the TFT in a saturation region is 1.5% or less. In addition, in order to hold a charge in a storage capacitor portion, it is required that an off current value is 1 pA or less.

However, a first factor with a variation of characteristics of TFTs is laser annealing. Even when the TFTs are arranged in parallel as in JP 2000-221903 and variation in crystallinity of a semiconductor region (channel formation region and regions in which source and drain regions are formed) produced at a size smaller than a width of a laser beam can be suppressed between adjacent TFTs, a variation in brightness which is periodically caused by scanning a linear pulse oscillating laser beam over the entire surface of a pixel region cannot be reduced. This is also due to a variation in characteristics of TFTs. When the periodic characteristic variation is estimated by light emitting brightness of the light emitting element, it is 10% or more. Thus, this cannot be compensated by the parallel connection of TFTs in a pixel.

SUMMARY OF THE INVENTION

The present invention has been made in view of the above. An object of the present invention is therefore to provide a display device in which a variation in brightness of light emitting elements between pixels due to a variation in characteristics of TFTs is reduced, reliability is high, and an image quality is superior.

In order to solve the above problem, according to a structure of the present invention, at least two TFTs which are connected with a light emitting element are provided, and crystallinities of semiconductor regions composing channel regions of the respective TFTs are made different from each other. As the semiconductor region, a region obtained by crystallizing an amorphous semiconductor film by laser annealing is applied. Then, in order to change the crystallinity, a method of changing a scan direction of a continuous oscillating laser beam so that crystal growth directions are made different from each other is applied. Alternatively, a method of changing a channel length direction of the TFT between the respective semiconductor regions without changing the scan direction of the continuous oscillating laser beam so that the crystal growth direction and a current flowing direction are different from each other is applied.

When the amorphous semiconductor film is crystallized by using the continuous oscillating laser beam, a crystal grows in the scan direction of the beam. In this case, a grain boundary is produced substantially along the scan direction of the beam. Thus, the influence of boundary trapping is eliminated and relatively high field effect mobility can be obtained. However, a boundary which inhibits a drift of a carrier is decreased so that characteristics of TFTs are greatly changed by a slight variation in an existence ratio thereof. As a result, a variation in characteristics thereof becomes larger. In order to reduce the influence, a structure in which the plurality of TFTs each having a semiconductor region in which the crystal growth direction is changed against the channel length direction or the existence ratio of the grain boundary is changed against a carrier drift direction are connected in parallel with a light emitting element is used.

With respect to a connection structure of the TFTs when it is viewed from the source and drain terminals, each one of the source regions and the drain regions which are formed in the respective semiconductor regions is connected with the light emitting element, and the others thereof are connected with each other through a wiring so as to apply the same potential thereto. In addition, in the plurality of TFTs, the same potential is applied to the common gate electrodes.

Also, with respect to the gate electrodes, a structure in which electrodes overlapped with the channel formation regions are provided over and under the semiconductor regions in first and second TFTs through insulating layers may be used. In this case, the same potential may be applied to both upper and lower gate electrodes or one of them may be kept to a fixed potential. Thus, the influence of a fixed charge in the insulating layers which are in contact with the semiconductor regions is eliminated, and a variation in threshold voltage can be reduced.

According to the structure of the display device provided by the present invention, in the display device having a pixel in which the first and second Is connected with the light emitting element are provided, the channel formation regions formed in the respective semiconductor regions composing the first and second TFTs are located such that the channel length directions are different from each other. Each one of the source regions and the drain regions which are formed in the respective semiconductor regions is connected with the light emitting element, and the others thereof are connected with each other through the wiring so as to apply the same potential thereto through the common gate electrodes.

Also, according to another structure, in a display device having a pixel in which first and second TFTs connected with a light emitting element are provided, a crystal is grown in a channel length direction in respective semiconductor regions composing the first and second TFTs. Each one of the source regions and the drain regions which are formed in the respective semiconductor regions is connected with the light emitting element, and the others thereof are connected with each other through the wiring so as to apply the same potential thereto through the common gate electrodes.

Also, according to another structure, in a display device having a pixel in which first and second TFTs connected with a light emitting element are provided, with respect to one of the respective semiconductor regions composing the first and second TFTs, a grain boundary is extended in parallel with a channel length direction. With respect to the other, a grain boundary is extended in a direction which intersects the channel length direction. Each one of the source regions and the drain regions which are formed in the respective semiconductor regions is connected with the light emitting element, and the others thereof are connected with each other through the wiring so as to apply the same potential thereto through the common gate electrodes.

Also, according to another structure, in a display device having a pixel in which first and second TFTs connected with a light emitting element are provided, with respect to one of the respective semiconductor regions composing the first and second TFTs, a grain boundary is extended in parallel with a channel length direction. With respect to the other, a grain boundary is extended in a direction which intersects the channel length direction. Each one of the source regions and the drain regions which are formed in the respective semiconductor regions is connected with the light emitting element, and the others thereof are connected with each other through the wiring so as to apply the same potential thereto through the common gate electrodes.

Also, according to another structure, in a display device having a pixel in which first and second TFTs connected with a light emitting element are provided, with respect to one of the respective semiconductor regions composing the first and second TFTs, a grain boundary is extended in parallel with a channel length direction. With respect to the other, a grain boundary is extended in a direction which intersects the channel length direction. Each one of the source regions and the drain regions which are formed in the respective semiconductor regions is connected with the light emitting element, and the others thereof are connected with each other through the wiring so as to apply the same potential thereto through the common gate electrodes.

When a scan direction of a continuous oscillating laser beam is changed or when TFTs are located so as not to coincide the channel length direction with the scan direction of the laser beam, crystallinity is changed and TFTs having different characteristics can be produced. When a plurality of such TFTs are provided and connected with the light emitting element, the characteristics of the TFTs connected with the light emitting element are substantially uniformed because crystallinities of the semiconductor regions composing the channel formation regions of the respective TFTs are different from each other. Thus, a variation in brightness of the light emitting element between pixels can be reduced. Accordingly, an image quality of the display device can be improved.

BRIEF DESCRIPTION OF THE DRAWINGS

In the accompanying drawings:

FIGS. 10A and 10B are explanatory diagrams of a structure of a laser annealing apparatus;

FIGS. 11A and 11B are explanatory diagrams of a structure of a laser annealing apparatus;

DETAILED DESCRIPTION OF THE PREFERRED EMBODIMENTS

Figure 1:
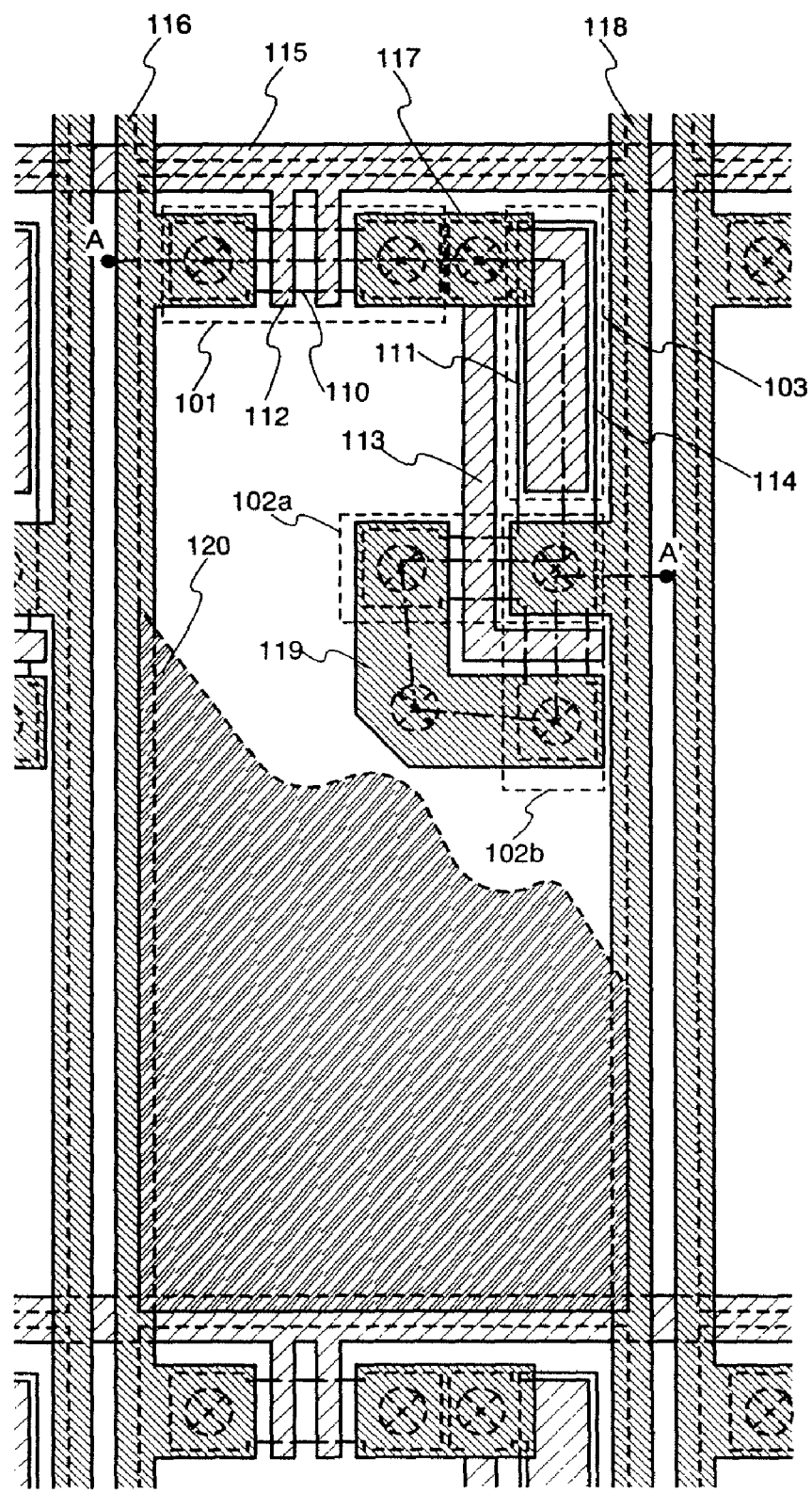
FIG. 1 is a top view showing a structure of a pixel in a display device according to the present invention.
Figure 2:
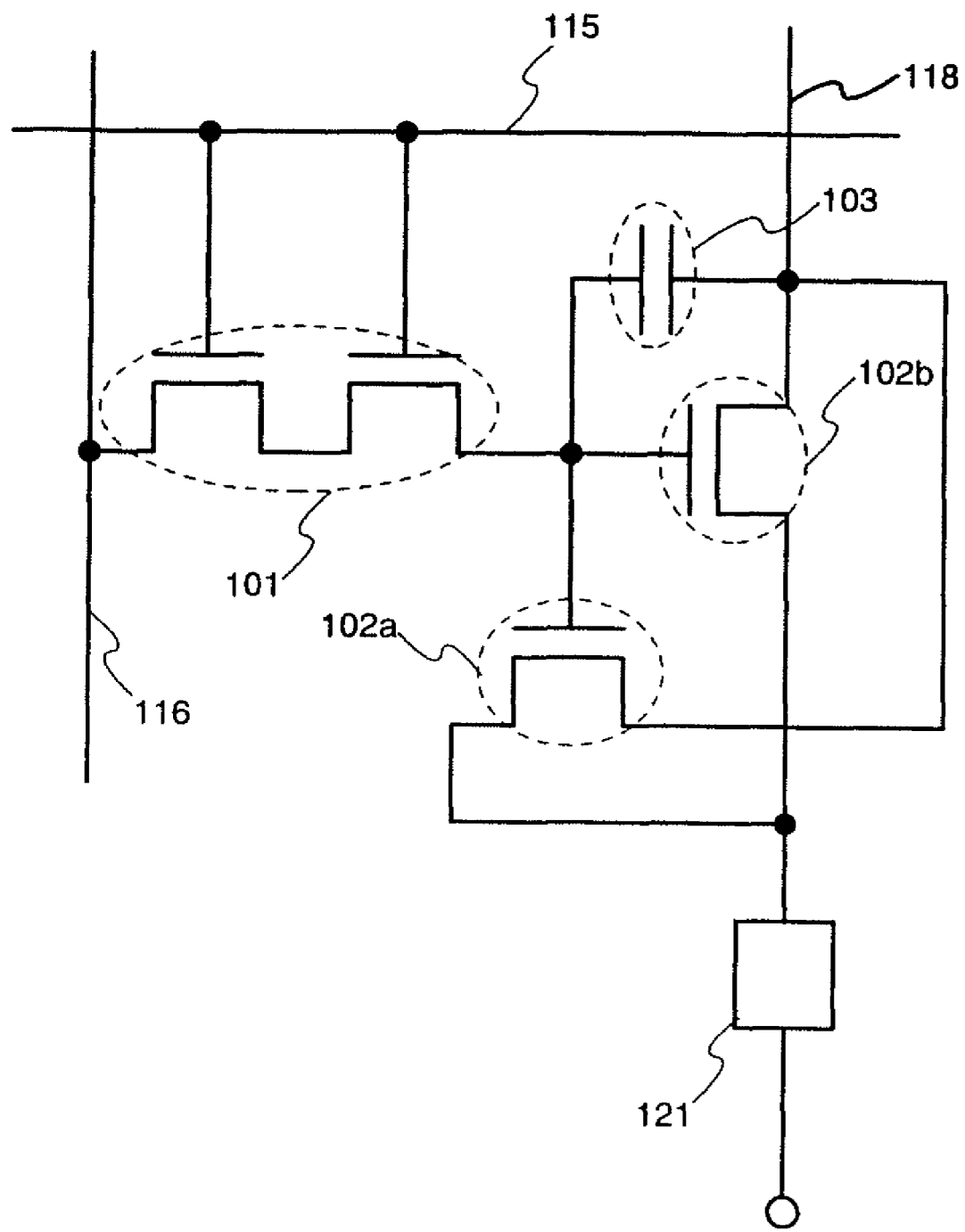
FIG. 2 is a circuit diagram showing a pixel circuit of the present invention.

Hereinafter, an embodiment of the present invention will be described with reference to the drawings. FIG. 1 is a top view showing a structure of a pixel in a display device according to the present invention. The pixel shown in FIG. 1 includes a switching TFT 101, current driver TFTs 102a and 102b, and a storage capacitor portion 103. In addition, FIG. 2 is an equivalent circuit diagram showing a structure of such a pixel, and a circuit diagram in which a light emitting element 121 is connected with the current driver TFTs 102a and 102b in addition to the structure shown in FIG. 1.

The switching TFT 101 is composed of a semiconductor region 110 in which source and drain regions, an LDD region, and the like are formed, a gate electrode 112, and the like. The source region is connected with a data line 116 to which a video signal is inputted. The drain region is connected with a gate electrode 113 of the current driver TFTs 102a and 102b through a wiring 117. The gate electrode 112 is connected with a scan line 115.

The current driver TFTs 102a and 102b commonly use the gate electrode 113 and a semiconductor region 111 in which source and drain regions, an LDD region, and the like are formed, but the channel length directions are different from each other. The source region of the current driver TFTs 102a and 102b is commonly used by the two TFTs and is connected with a power source line 118. In addition, the drain regions of the respective TFTs are connected with each other through a wiring 119.

A connection electrode 119 is connected with a first electrode 120 as an anode or a cathode of the light emitting element. The light emitting element is not shown in FIG. 1 but formed by laminating an organic compound layer including a phosphor and a counter electrode on the first electrode 120.

Also, the storage capacitor portion 103 is formed by interposing an insulating layer between the semiconductor region 111 and a capacitor electrode 114 formed in the same layer as the gate electrode 113.

The remarkable structure in FIG. 1 is that the current driver TFTs 102a and 102b are formed such that the channel length directions thereof are different from each other. A variation in characteristics of the current driver TFTs is reduced by using such a structure. Specifically, a direction in which a carrier is drifted and a crystal growth direction are made different from each other in the respective semiconductor regions of the two TFTs connected in parallel so that different electrical characteristics are provided to the adjacent TFTs.

Table 1 shows a comparison result among field effect mobility ($\mu$), an S value (subthreshold coefficient), and Ion (on current) with respect to a TFT in which a channel length direction coincides with a direction parallel with a crystal growth direction (scan direction of a laser beam) and a TFT in which the channel length direction intersects the crystal growth direction. There are obtained from the measured samples, a channel length (L) and a channel width (W) which are 8 $\mu$m, respectively, and average values of 8 samples are indicated. In the case of an n-channel TFT, a measurement condition of the field effect mobility is when a drain voltage (Vd) of 1 V and a gate voltage (Vg) of 5 V are applied thereto. A measurement condition of the S value is when Vd of 1 V is applied. A measurement condition of the on current is when Vd of 5 V and Vg of 5V are applied. Note that in the case of a p-channel TFT, a polarity of each voltage is set to be minus.

TABLE 1

|  | n-channel TFT | | p-channel TFT | |
| --- | --- | --- | --- | --- |
|  | Parallel | Intersect | Parallel | Intersect |
| $\mu$ (cm$^2$/Vsec) | 274.21 | 87.41 | 147.21 | 52.92 |
| S-value (V/dec) | 0.22 | 0.25 | 0.18 | 0.21 |
| Ion ($\mu$A) | 29.28 | 8.14 | 13.39 | 3.26 |

L/W = 8/8$\mu$
n = 8

From the result shown in Table 1, it is found that the field effect mobility and the on current value become higher in the case where the direction in which the carrier is drifted and the crystal growth direction are in parallel (coincident), as compared with the case where they intersect each other. This indicates that, when the carrier is drifted, it intersects a grain boundary so that the carrier is trapped by a defect, thereby reducing carrier transport efficiency. In other words, when the crystal growth direction and the channel length direction of the TFT are made coincident, current drive capacity of the TFT is improved. On the other hand, when they are not made coincident, the capacity is reduced.

Figure 7:
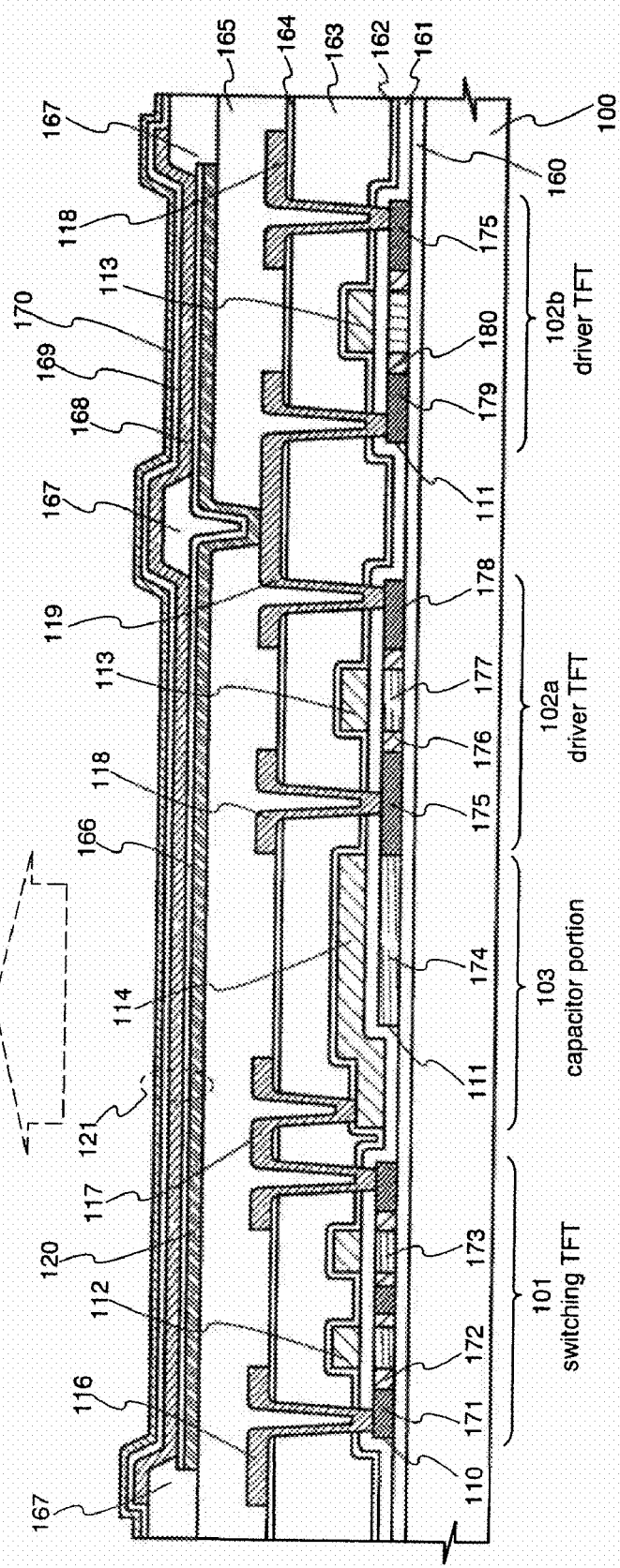
FIG. 7 is a longitudinal cross sectional view for explaining a structure of the pixel portion of the display device according to the present invention.

FIG. 7 is a longitudinal cross sectional view corresponding to an A-A' line in FIG. 1. A glass substrate, a quartz substrate, a semiconductor substrate, or the like is applied as a substrate 100. An insulating surface is produced by a first insulating layer 160. In the semiconductor regions 110 and 111, high concentration impurity regions 171, 175, 178, and 179 composing source and drain regions, low concentration impurity regions 172, 176, and 180 composing LDD regions, and non-doped regions 173, 174, and 177 are formed. A second insulating layer 161 serves as a gate insulating film. A third insulating layer 162, a fourth insulating layer 163, and a fifth insulating layer 164 each serve as a passivation film or an interlayer film. A sixth insulating layer 165 is formed as a planarizing film in order to produce the light emitting element.

The light emitting element 121 is composed of the first electrode 120, an organic compound layer 168, and a second electrode 170. The first electrode 120 and the second electrode 170 can be divided into a cathode and an anode in accordance with a polarity of a forward voltage to be applied. When the first electrode 120 is used as the cathode, a layer 166 containing alkali metal or alkali earth metal with a low work function is provided thereto. In the second electrode 170 side, a layer 169 containing gold, platinum, titanium nitride, or the like with a high work function is formed. These layers are formed at a thickness of about 1 nm to 20 nm in order to provide light transmission property. According to such a structure, light from the light emitting element is emitted in a direction indicated by an arrow in the drawing.

Figure 3:
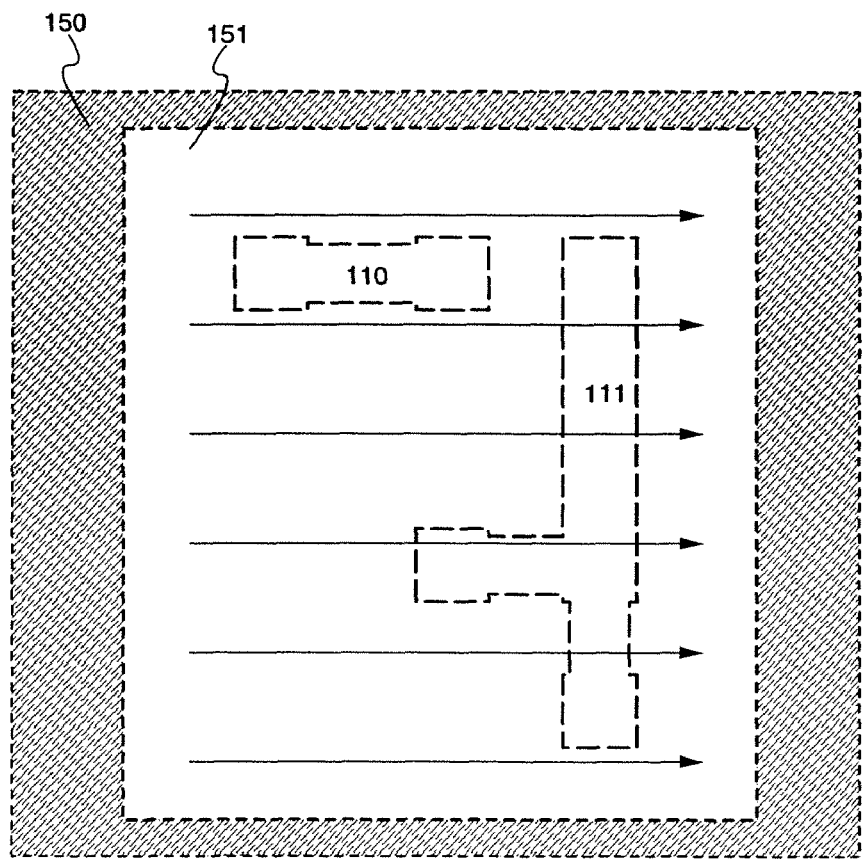
FIG. 3 is a top view for explaining a step of manufacturing a pixel portion of the display device according to the present invention.

Next, a process of manufacturing a light emitting device according to the present invention will be described with reference to FIGS. 3 to 6. FIG. 3 shows a step of crystallizing an amorphous semiconductor film 150 formed on the insulating surface by laser annealing. A beam shape by the laser annealing can be made to have an arbitrary shape such as an ellipse, a rectangle, or oblong. It is preferably made to be an ellipse or a linear shape having an aspect ratio of 10 or more with respect to a longitudinal direction and a widthwise direction, and a beam is scanned along the widthwise direction. When a continuous oscillating laser beam is scanned for crystallization, a liquid-solid interface is continuously moved so that a polycrystalline semiconductor film in which a grain boundary is extended in a direction substantially parallel with a scan direction can be formed. It is unnecessary to crystallize the entire surface of the amorphous semiconductor film and only a part in which the semiconductor region is formed may be crystallized. Here, arrows shown in FIG. 3 indicate the scan direction of the laser beam and dotted lines indicate parts in which the semiconductor regions 110 and 111 are formed.

When a carrier is drifted, carrier mobility is changed by about 10% to 30% based on whether it flows in a direction parallel with the grain boundary or in an intersecting direction, and the mobility in the former becomes higher. In other words, when the laser beam is scanned in only single direction, a crystal having an electrical anisotropy can be formed.

Figure 8:
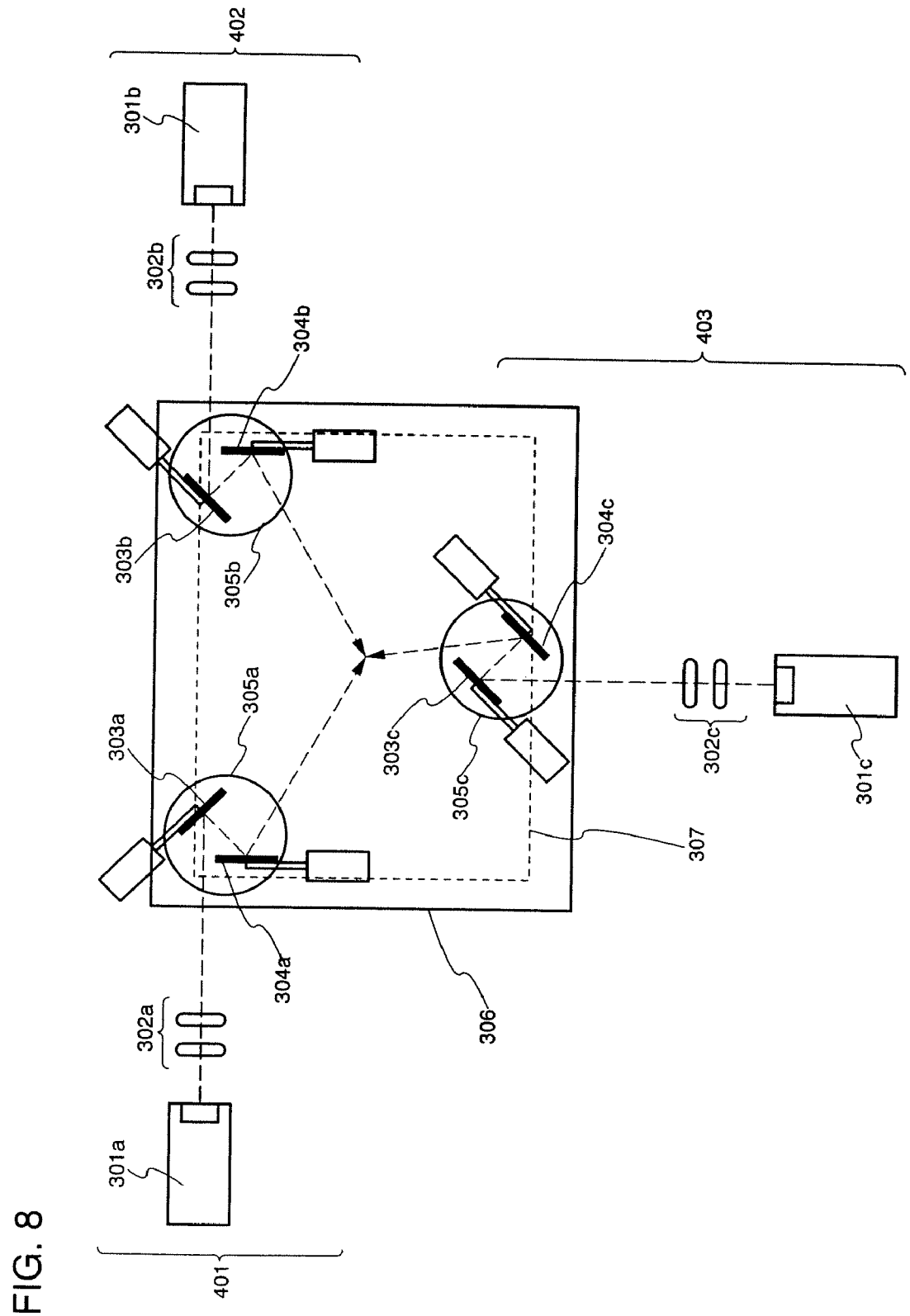
FIG. 8 is an explanatory diagram of a structure of a laser annealing apparatus.
Figure 9:
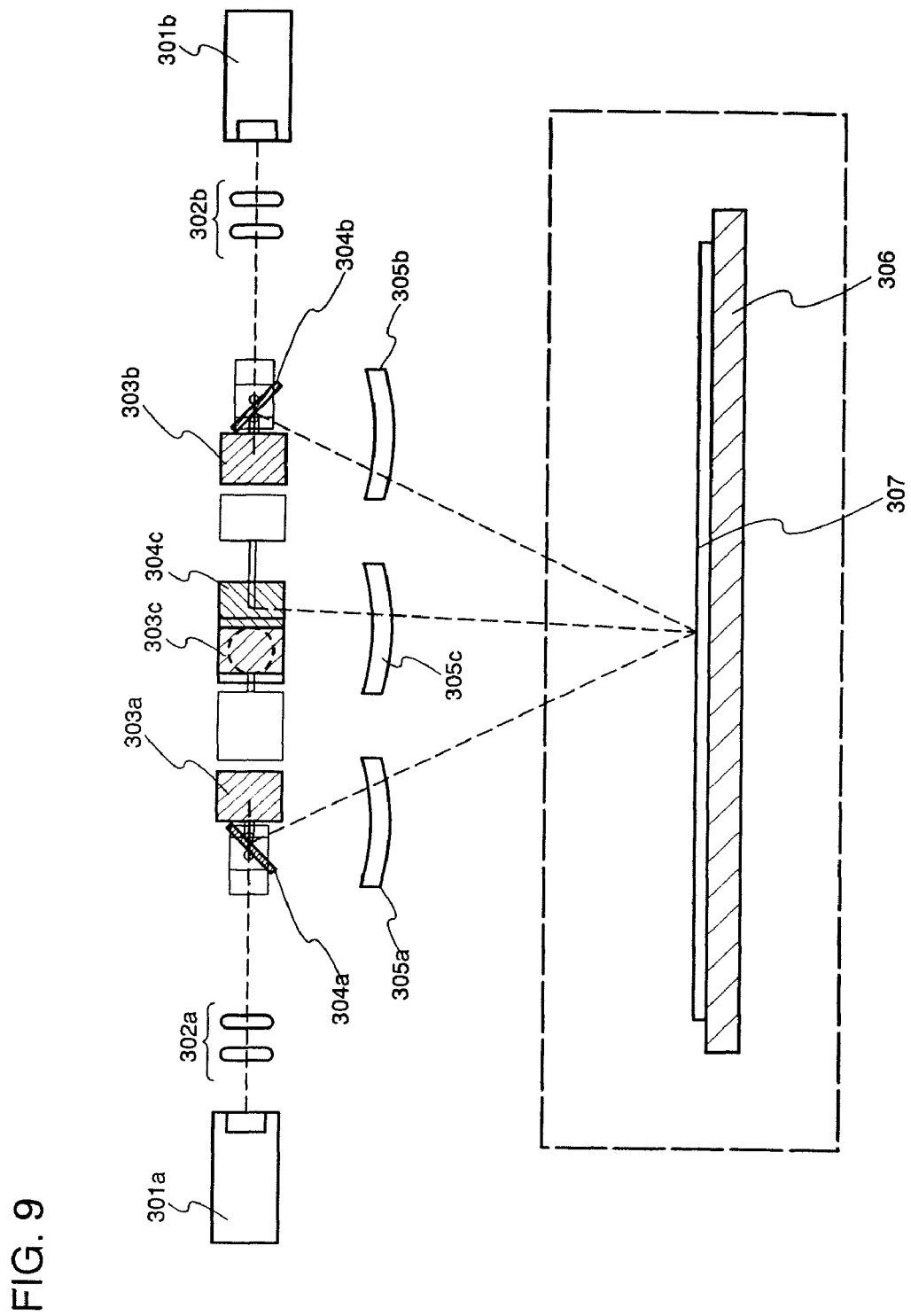
FIG. 9 is an explanatory diagram of the structure of the laser annealing apparatus.
Figure 12:
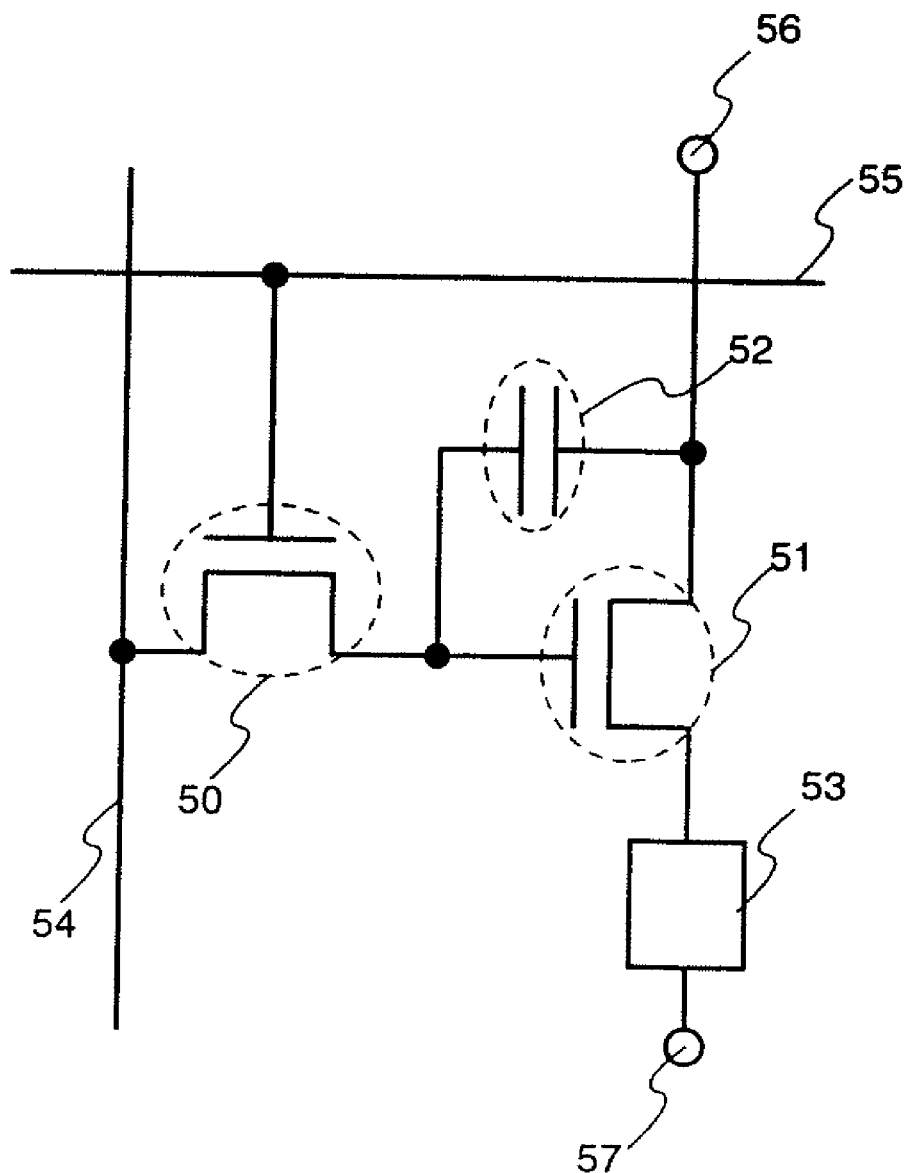
FIG. 12 is a circuit diagram showing an example of a conventional pixel circuit.

An example of a structure of a laser annealing apparatus capable of performing such crystallization processing is shown in FIGS. 8 and 9. FIG. 8 is a top diagram showing the structure of the laser annealing apparatus and FIG. 9 is a cross sectional diagram corresponding to FIG. 8. In FIGS. 8 and 9, common reference numerals are used for convenience of description.

The laser annealing apparatus is capable of specifying an arbitrary position of a substrate and irradiating a laser beam thereto to conduct crystallization. When a plurality of laser beams are irradiated from a plurality of directions, a throughput can be further improved. In addition, the apparatus is constructed such that the laser beams can be overlapped on an irradiation surface to obtain an energy density required for laser annealing and to eliminate the interference of lights.

A first optical system 401 is composed of a laser oscillating device 301a, a lens group 302a, a first galvanomirror 303a, a second galvanomirror 304a, and an fθ lens 305a. Here, the first galvanomirror 303a and the second galvanomirror 304a are provided as deflection means.

A second optical system 402 and a third optical system 403 each have the same structure. That is, a second optical system 402 is composed of a laser oscillating device 301b, a lens group 302b, a first galvanomirror 303b, a second galvanomirror 304b, and an fθ lens 305b. Here, the first galvanomirror 303b and the second galvanomirror 304b are provided as deflection means. And, a third optical system 403 is composed of a laser oscillating device 301c, a lens group 302c, a first galvanomirror 303c, a second galvanomirror 304c, and an fθ lens 305c. Here, the first galvanomirror 303c and the second galvanomirror 304c are provided as deflection means. A deflection direction of a laser beam is controlled by rotation angles of the first galvanomirror and the second galvanomirror. The laser beam is irradiated to an object to be processed 307 on a location stage 306. The beam diameter cart be made an arbitrary shape by providing the lens group 302a and, if necessary, a slit and the like, and may be made a circle, an ellipse, or a rectangle with a size of substantially several tens of μm to several hundred μm. The location stage 306 is fixed. However, it can be also synchronized with scanning of the laser beam. Thus, the stage may be movable in an X-, Y-, or θ-direction.

Then, the laser beams irradiated to the object to be processed are overlapped by the first to third optical systems so that an energy density required for laser annealing can be obtained and the interference of lights can be eliminated. The laser beams emitted from different laser oscillating devices have different phases. Thus, the interference can be eliminated by overlapping them.

Note that the structure in which the three laser beams emitted from the first to third optical systems are overlapped is indicated here. However, the same effect is obtained without limiting the three laser beams, and therefore a purpose is achieved by overlapping a plurality of laser beams. In addition, if the same effect is obtained, the structure of the laser annealing apparatus is not limited to that shown in FIGS. 8 and 9.

Also, as another structure of the laser anneal apparatus, an apparatus having an structure shown in FIGS. 10A and 10B can be also applied. FIGS. 10A and 10B are a front diagram and a side diagram, showing a structure of a laser annealing apparatus which is composed of a laser oscillating device 801, high conversion mirrors 802 to 804, an elliptical beam forming optical system 805, and a location stage 808. An example of the elliptical beam forming optical system 805 is a combination of a cylindrical lens 806 and a convex lens 807. The beam is formed in an elliptical shape by the cylindrical lens 806 and condensed by the convex lens 807. Thus, when the laser beam is formed to be an ellipse, an irradiation area is increased and a processing speed can be improved. In addition, gas jet means 820 is provided immediately on a laser beam irradiation surface or in the vicinity thereof, thereby controlling an atmosphere of a region to which the laser beam is irradiated. With respect to a kind of gas, various gases such as an oxidizing gas, a reducing gas, and an inert gas can be applied.

Also, according to the apparatus, the location stage 808 is moved in biaxial directions by actuating means 821 so that laser annealing can be performed for a substrate 809. In the case of movement in one direction, it can be continuously moved by a distance longer than a length of a side of the substrate at a uniform speed of 1 cm/sec to 200 cm/sec. In the case of movement in another direction, it can be discontinuously moved stepwise by the same degree as in a longitudinal direction of an elliptical beam. The oscillation of the laser oscillating device 801 and the location stage 808 are synchronous with each other by control means 810 in is which a microprocessor is incorporated. In addition, it is constructed such that the laser beam reflected by the substrate 809 (return light) is not incident into the optical systems again when an incident angle of the laser beam is set to a specific angle.

On the other hand, FIGS. 11A and 11B show an example of a structure in which a location stage 814 is fixed and a laser beams is scanned, and a front diagram and a side diagram, showing a structure of a laser annealing apparatus which is composed of the laser oscillating device 801, the high conversion mirrors 802 and 803, an elliptical beam forming optical system 811, a pair of galvanomirrors 812 in which XY scanning is possible, and an fθ lens 813. An example of the elliptical beam forming optical system 811 is a combination of a concave lens and a convex lens. Thus, when the laser beam is formed to be an ellipse, an irradiation area is increased and a processing speed can be improved. A deflection direction is controlled by rotation angles of the galvanomirrors so that the laser beam can be irradiated to an arbitrary position of the substrate 809 on the location stage 814. The oscillation of the laser oscillating device 801 and the set of galvanomirrors 812 are synchronous with each other by the control means 810 in which a microprocessor is incorporated. In addition, an isolator 815 is disposed so as to prevent that the laser beam reflected by the irradiation surface (return light) is incident into the laser oscillating device again to damage the optical systems. The gas jet means 820 is provided, thereby controlling an atmosphere of a region to which the laser beam is irradiated. With respect to a kind of gas, various gases such as an oxidizing gas, a reducing gas, and an inert gas can be applied.

Figure 4:
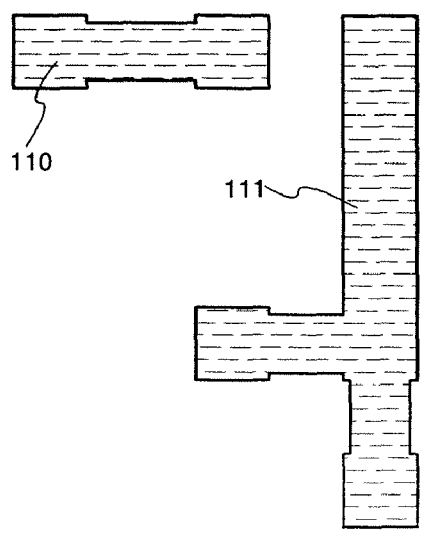
FIG. 4 is a top view for explaining a step of manufacturing the pixel portion of the display device according to the present invention.
Figure 5:
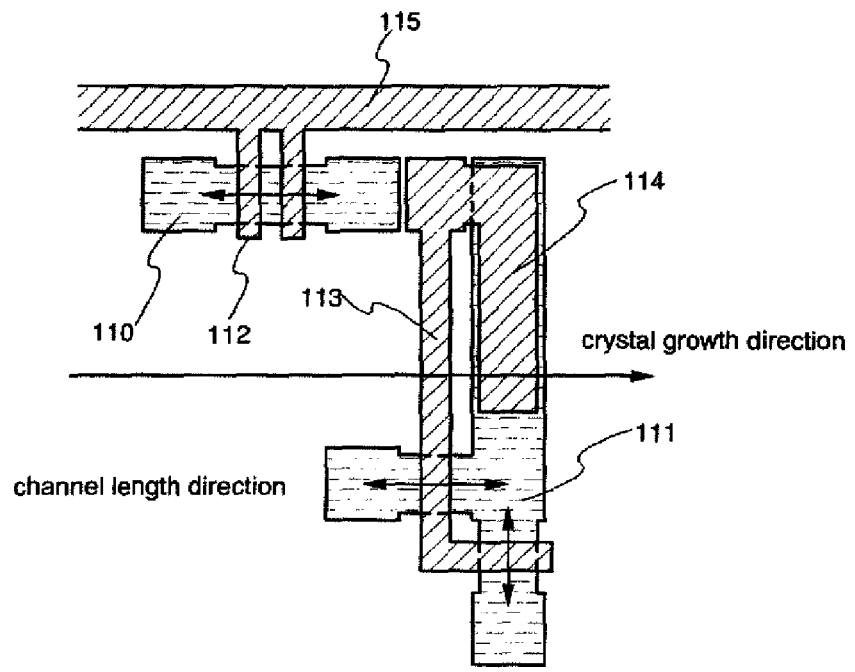
FIG. 5 is a top view for explaining a step of manufacturing the pixel portion of the display device according to the present invention.

FIG. 4 shows a state in which the semiconductor regions 110 and 111 are formed. Even if the semiconductor film is divided in an island shape, the crystallinity is kept. As compared with FIG. 3, a crystal grain is extended in the longitudinal direction of the semiconductor region 110.

Next, a gate insulating film is formed, and then gate electrodes 112 and 113 and a capacitor electrode 114 are formed. The gate electrode 112 is connected with the scan line 115 formed on the same layer. The gate electrodes are formed so as to intersect the semiconductor regions. Thus, channel length directions are determined as shown in the drawing. A channel length corresponds to a distance between a source and a drain in an MOS transistor or the like. Thus, a direction in which the channel length is determined is called the channel length direction according to the same definition here.

In the semiconductor region 110, a TFT in which the channel length direction and the crystal growth direction are substantially coincident is formed. On the other hand, in the semiconductor region 111, two TFTs, that is, a TFT in which the channel length direction and the crystal growth direction are substantially coincident and a TFT in which they are not coincident are formed. Thus, the TFTs can be formed as appropriate based on a position relationship between the semiconductor region and the gate electrode. The structure shown in FIG. 5 indicates this example.

Figure 6:
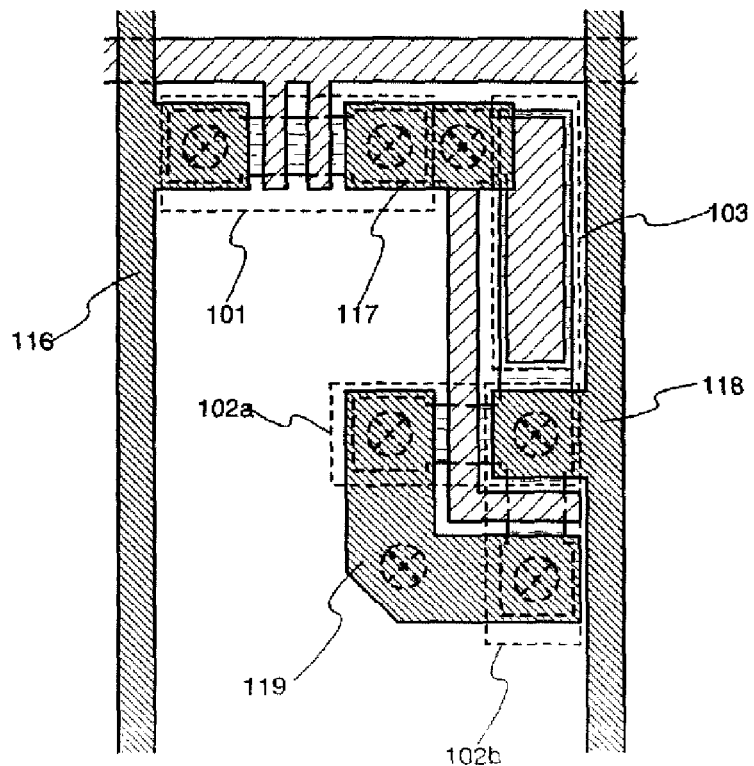
FIG. 6 is a top view for explaining a step of manufacturing the pixel portion of the display device according to the present invention.

FIG. 6 shows a state in which an insulating layer is formed in an upper layer of an interlayer insulating film therethrough, contact holes are formed in predetermined positions, and then the data line 116, the power source line 118, and the wirings 117 and 119 are formed. In the pixel, the switching TFT 101, the current driver TFTs 102a and 1021), and the storage capacitor portion 103 are formed.

Figure 16:
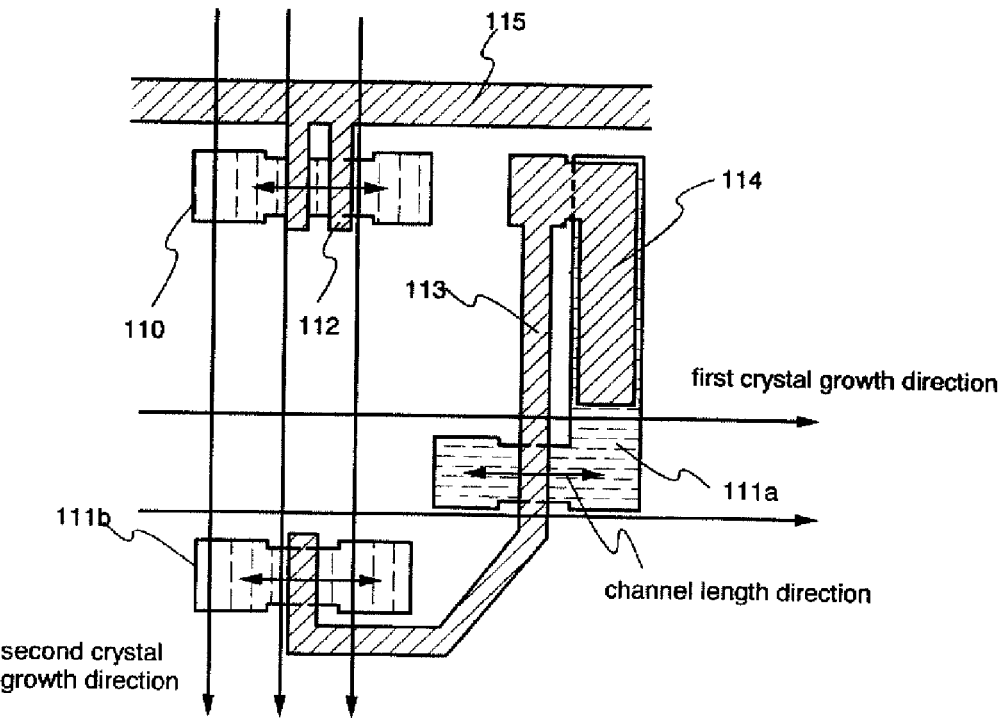
FIG. 16 is a top view for explaining a step of manufacturing the pixel portion of the display device according to the present invention.
Figure 17:
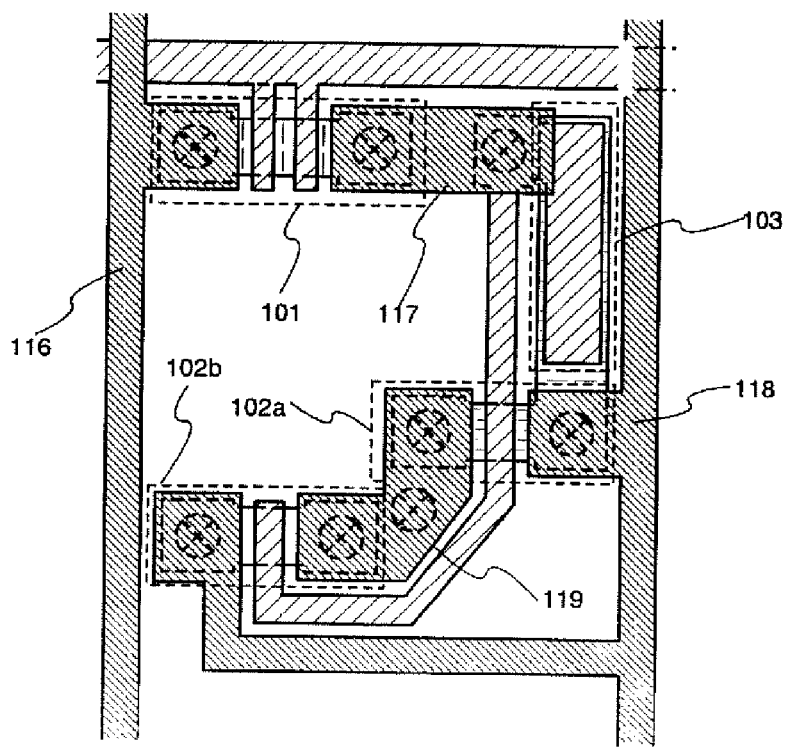
FIG. 17 is a top view for explaining a step of manufacturing the pixel portion of the display device according to the present invention.

In addition, the structure in which a carrier drift direction and a crystal growth direction are made different from each other in accordance with the location of the semiconductor regions is indicated here. When a scan direction of the beam is changed in laser annealing, the same effect can be obtained. FIG. 16 shows a structure in which the scan direction is changed. Semiconductor regions 110, 111a and 111b are formed such that channel length directions are the same with each other. Laser beam scanning is conducted in at least two different directions of first crystal growth direction and second crystal growth direction. As a result, crystals in the semiconductor regions 110 and 111b grow in a direction intersecting the channel length direction, while crystals in the semiconductor region 111a grow in a direction parallel to the channel length direction. After that, as shown in FIG. 17, the data line 116, the power source line 118, the wirings 117 and 119 are formed so that the switching TFT 101, the current driver TFTs 102a and 102b, and the storage capacitor portion 103 are formed.

In the pixel formed by the above steps, in order to keep a current $I_D$ flowing into the light emitting element constant, a drain voltage $V_{DS}$ of the current control TFT is set to a gate voltage $V_{GS}$ or higher so that it is operated in a saturation region so as to flow a constant drain current $I_D$ without depending on the drain voltage $V_{DS}$ of the current driver TFT. Thus, the constant current is supplied to the light emitting element.

For example, assume that a threshold voltage of the current control TFT is about 2 V. Here, the gate voltage $V_{GS}$ of the current control TFT is set to 5 V, and a voltage between the counter electrode of the light emitting element and the power source supply line (difference between a counter potential and a power source potential) during a display period is set to about 15 V. In this time, a voltage $V_{EL}$ between both electrodes of the light emitting element becomes a value of about 5 V to 10 V, and the drain voltage $V_{DS}$ of the current control TFT becomes 5 V or higher. Thus, the drain voltage $V_{DS}$ becomes a voltage equal to or higher than the gate voltage $V_{GS}$ so that the current control TFT operates in the saturation region. When the current driver TFT is operated in the saturation region, the following equation (1) is held. That is, $$I_D = \mu C_o W/L (V_{GS} - V_{TH})^2 / 2 \qquad (1)$$

where $V_{GS}$ is a gate voltage, μ is mobility, $C_o$ is a gate capacitance per unit area, W is a channel width, L is a channel length, $V_{TH}$ is a threshold, and $I_D$ is a drain current. Here, μ, $C_o$, W, L, and $V_{TH}$ each are a fixed value determined by the respective TFTs. According to the equation (1), even when the current driver TFTs 102a and 102b have the same W and the same L, they have different μ. Thus, a drain current $I_D$ is changed in the respective TFTs. Accordingly, when such TFTs are connected in parallel, a variation in $I_D$ due to variation in crystallinity can be leveled.

Also, in order to suppress the variation, it is effective that, in a range of operation in a saturation region, a ratio W/L of a gate width W to a gate length L is reduced and a gate voltage $V_{GS}$ is increased. Thus, a variation in drain current $I_D$ due to a variation in threshold voltage $V_{th}$ of the current driver TFT can be suppressed and variation in brightness of the light emitting element to be connected can be reduced.

With respect to the structure of the light emitting element, there is no specifically limited matter. The organic compound layer specifically includes a light emitting layer, a hole injection layer, an electron injection layer, a hole transport layer, and an electron transport layer. The light emitting element has a structure in which the anode, the light emitting layer, and the cathode are laminated in order. In addition to such a structure, it may have a structure in which the anode, the hole injection layer, the light emitting layer, and the cathode are laminated in order or a structure in which the anode, the hole injection layer, the light emitting layer, the electron transport layer, and the cathode are laminated in order. Low molecular organic compounds or polymeric organic compounds can be applied to the organic compound layer. With respect to an example of the low molecular system organic compound, α-NPD (4,4'-bis-[N-(naphthyl)-N-phenyl-amino]biphenyl) which is a copper phthalocyanine (CuPc) aromatic amine material or MTDATA (4,4',4"-tris(N-3-methylphenyl-N-phenyl-amino) triphenylamine) is known for the hole injection layer. In addition, tris-8-quinolinolato aluminum ($Alq_3$) complex is known for the light emitting layer. For the case of the polymeric organic light emitting material, polyaniline or polythiophene derivative (PEDOT) is known.

An inorganic compound material may be applied to a charge injection transport layer. It is diamond like carbon (DLC), carbon nitride (CN), Si, Ge, an oxide thereof, or a nitride thereof, and may be a material doped with P, B, N, or the like as appropriate. In addition, it may be an alkali metal oxide, an alkali earth metal oxide, an alkali metal nitride, an alkali earth metal nitride, an alkali metal fluoride, an alkali earth metal fluoride, or a compound or an alloy of the metal and at least Zn, Sn, V, Ru, Sm or In.

The above described materials are examples. These materials are used and respective functional layers such as the hole injection transport layer, the hole transport layer, the electron injection transport layer, the electron transport layer, the light emitting layer, an electron blocking layer, and a hole blocking layer are laminated as appropriate so that the light emitting element can be produced. In addition, a mixing layer or a mixing junction obtained by combining these respective layers may be produced. The electroluminescence includes light emission (fluorescence) produced when it is returned from a singlet excitation state to a ground state and light emission (phosphorescence) produced when it is returned from a triplet excitation state to the ground state. The electroluminescence element according to the present invention may use one of the light emissions or both light emissions.

Figure 13A:
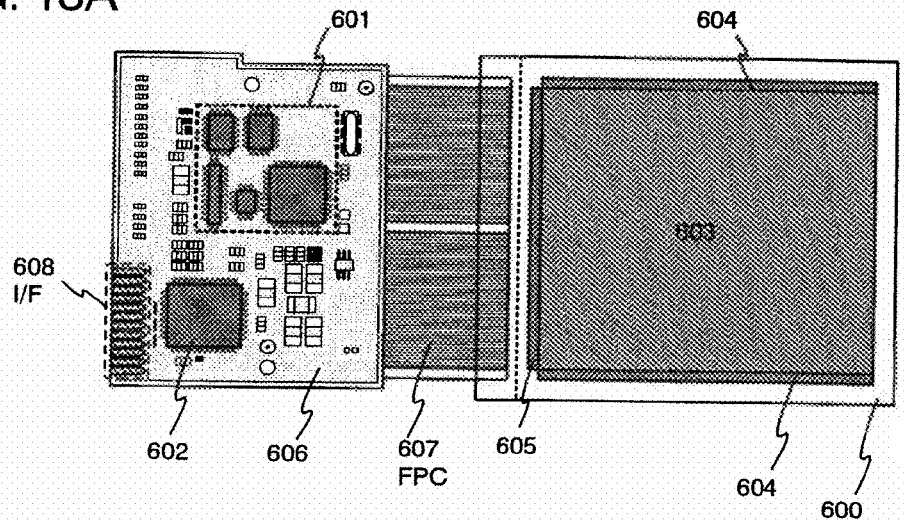
FIGS. 13A and 13B show a mode of a structure obtained by modularizing a panel in which a light emitting element is formed.
Figure 13B:
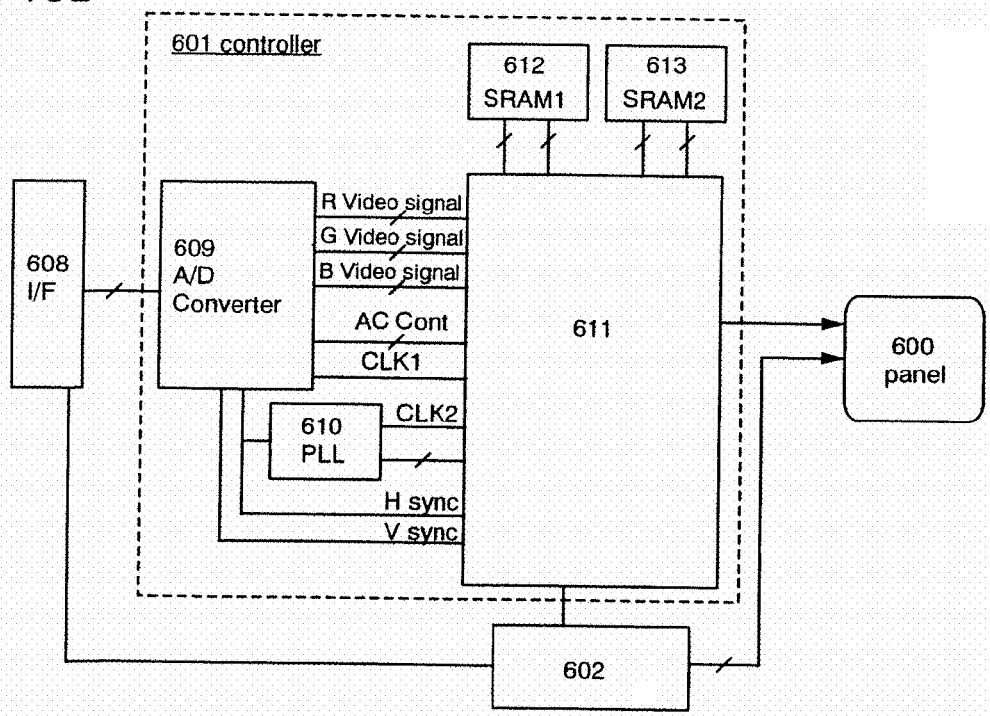

FIGS. 13A and 13B show a structure obtained by modularizing a panel having a pixel shown in FIG. 1 in which TFTs and a light emitting element are formed on a substrate having an insulating surface. As shown in FIGS. 13A and 13B, a module in which an IC including a power source circuit and the like are incorporated is mounted on the panel.

FIG. 13A is an outline view of a module in which a controller 601 and a power source circuit 602 are incorporated in a panel 600. In the panel 600, a pixel portion 603 in which a light emitting element is provided to each pixel, a scan line driver circuit 604 for selecting a pixel in the pixel portion 603, and a signal line driver circuit 605 for supplying a video signal to the selected pixel are provided. In addition, the controller 601 and the power source circuit 602 are provided in a printed substrate 606. Various signals and a power source voltage which are outputted from the controller 601 and the power source circuit 602 are supplied to the pixel portion 603, the scan line driver circuit 604, and the signal line driver circuit 605 in the panel 600 through an FPC 607.

A power source voltage and various signals are supplied to the printed substrate 606 through an interface (I/F) portion 608 in which a plurality of input terminals are located. Note that in this embodiment, the printed substrate 606 is incorporated in the panel 600 using the FPC. However, the present invention is not necessarily limited to such a structure. The controller 601 and the power source circuit 602 may be directly incorporated in the panel 600 using a COG (chip on glass) method. In addition, there is the case where in the printed substrate 606, a noise is entered to the power source voltage and the signals by a capacitance produced between wirings to be arranged, a resistance of a wiring itself, and the like so that the rising of the signal becomes slow. Thus, various elements such as a capacitor and a buffer may be provided to the printed substrate 606, thereby preventing that a noise is mixed into the power source voltage and the signals and the rising of the signal becomes slow.

FIG. 13B is a block diagram of a structure of the printed substrate 806. The various signals and the power source voltage supplied to the interface portion 608 are supplied to the controller 601 and the power source circuit 602. The controller 601 has an A/D converter 609, a phase locked loop (PLL) 610, a control signal generating portion 611, and SRAMs (static random access memories) 612 and 613. Note that the SRAM is used in this embodiment. However, instead of the SRAM, an SDRAM can be used. Alternatively, a DRAM (dynamic random access memory) can be also used if data write and data readout are possible at a high speed.

Video signals supplied through the interface portion 608 are converted from parallel to serial by the A/D converter 609 and inputted as video signals corresponding to respective colors of R, G, and B to the control signal generating portion 611. In addition, based on the various signals supplied through the interface portion 608, an Hsync signal, a Vsync signal, a clock signal CLK, and an alternating current voltage (AC Cont) are generated by the A/D converter 609 and inputted to the control signal generating portion 611.

The phase locked loop 610 has a function for adjusting frequencies of the various signals supplied through the interface portion 608 and an operating frequency of the control signal generating portion 611. The operating frequency of the control signal generating portion 611 is not necessarily equal to the frequencies of the various signals supplied through the interface portion 608, but the operating frequency of the control signal generating portion 611 is adjusted by the phase locked loop 610 such that they are synchronized with each other. The video signals inputted to the control signal generating portion 611 are temporally written into the SRAMs 612 and 613 and held therein. In the control signal generating portion 611, of the video signals of all bits held in the SRAM 612, the video signals corresponding to all pixels are read bit by bit and supplied to the signal line driver circuit 605 of the panel 600.

Also, the control signal generating portion 611 supplies information with respect to a period for which the light emitting element emits light for each bit to the scan line driver circuit 604 of the panel 600. The power source circuit 602 supplies a predetermined power source voltage to the signal line driver circuit 605, the scan line driver circuit 604, and the pixel portion 603 in the panel 600.

Next, a detailed structure of the power source circuit 602 will be described using FIG. 14. The power source voltage of this embodiment is composed of a switching regulator 654 using four switching regulator controllers 660 and a series regulator 655. Generally, a switching regulator is compact and light weight as compared with a series regulator and can conduct not only step-down but also step-up and polarity inversion. On the other hand, the series regulator is used for only step-down. The precision with respect to an output voltage is higher than that in the switching regulator, and a ripple and a noise are hardly generated.

Figure 14:
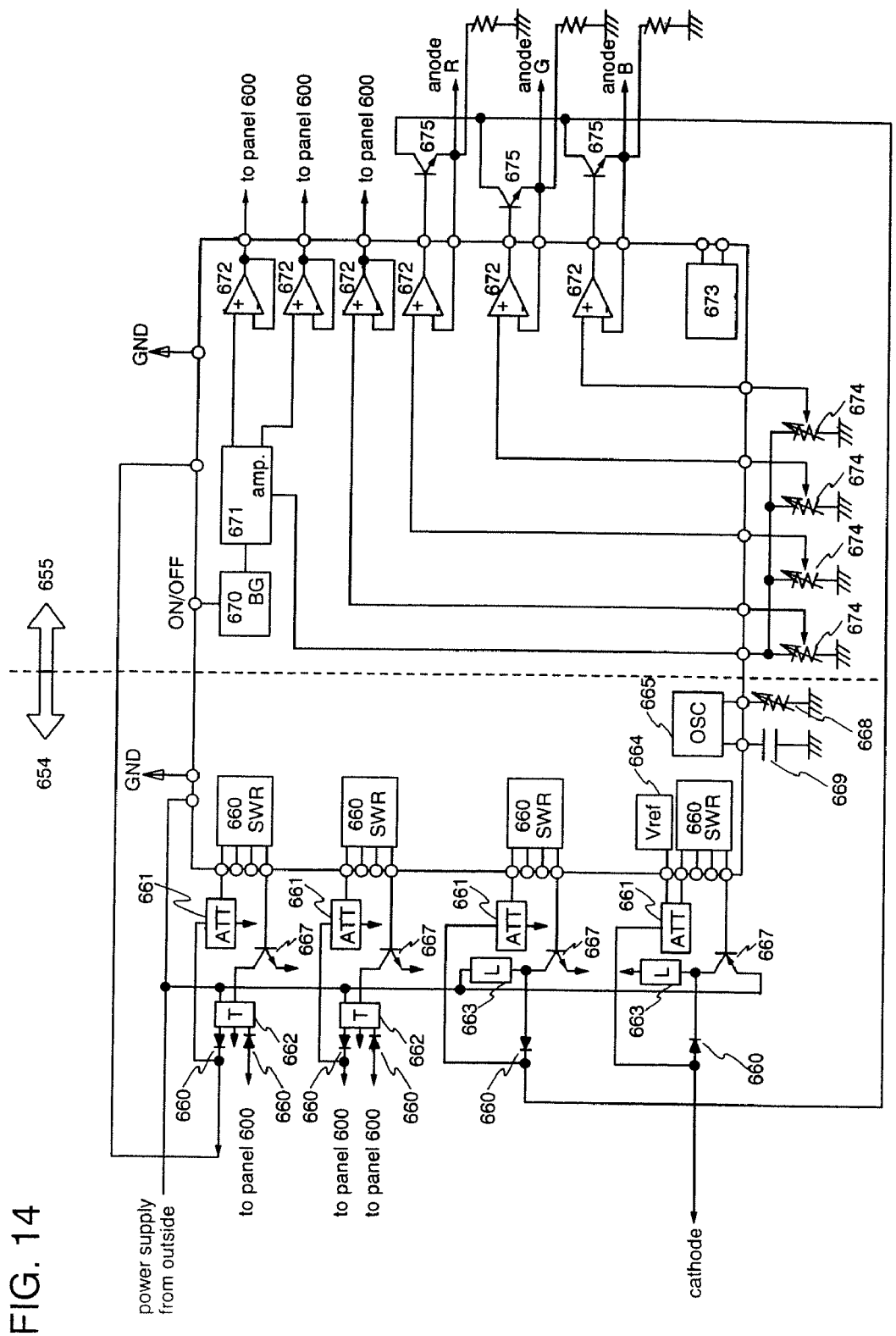
FIG. 14 is an explanatory diagram of a power source circuit in a mode of a structure obtained by modularizing the panel in which the light emitting element is formed.

The switching regulator 654 shown in FIG. 14 has the switching regulator controllers (SWR) 660, attenuators (ATT) 661, transformers (T) 662, inductors (L) 663, a reference power source (Vref) 664, an oscillating circuit (OSC) 665, diodes 666, bipolar transistors 667, a variable resistor 668, and a capacitor 669.

In the switching regulator 654, a voltage of an external Li ion battery (3.6 V) or the like is converted to generate a power source voltage provided to a cathode and a power source voltage supplied to the series regulator 655. In addition, the series regulator 655 has a band gap circuit (BG) 670, an amplifier 671, operational amplifiers 672, a current source 673, variable resistors 674, and bipolar transistors 675, and the power source voltage generated by the switching generator 654 is supplied thereto. In the series regulator 655, the power source voltage generated by the switching generator 654 is used, and a direct current power source voltage provided to a wiring for supplying a current to an anode of a light emitting element of each color (current supply line) is generated based on a predetermined voltage generated by the band gap circuit 670.

Note that the current source 673 is used in the case of a drive method in which a current of a video signal is written into a pixel. In this case, a current generated by the current source 673 is supplied to the signal line driver circuit 605 of the panel 600. In the case of a drive method in which a voltage of a video signal is written into a pixel, the current source 673 is not necessarily provided. The switching regulator, the OSC, the amplifier, and the operational amplifier can be formed by using the manufacturing method of the present invention.

Combined with this type of module, an example of electronic equipment equipped with the display device of the present invention is shown in FIGS. 15A-15E.

Figure 15A:
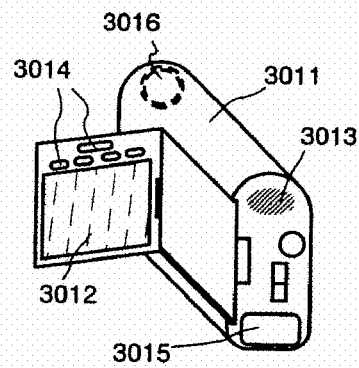
FIGS. 15A to 15E show examples of electronic devices to which the display device of the present invention is applied

FIG. 15A shows an example of a video camera equipped with the present invention, which is composed of a main body 3011, a display portion 3012, an voice input portion 3013, an operational switch 3014, a battery 3015, an image receiving portion 3016, and the like. By applying this invention, a video camera with an improved picture quality of display portion 3012 can be completed.

Figure 15B:
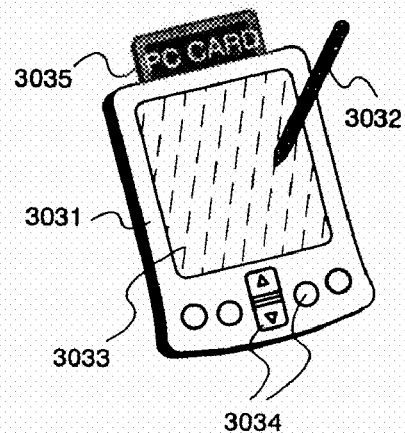

FIG. 15B shows an example of a PDA (Personal Digital Assistant) equipped with the present invention, which is composed of a main body 3031, a stylus 3032, a display portion 3033, an operation button 3034, an external interface 3035, and the like. By applying this invention, a PDA with an improved picture quality of display portion 3033 can be completed.

Figure 15C:
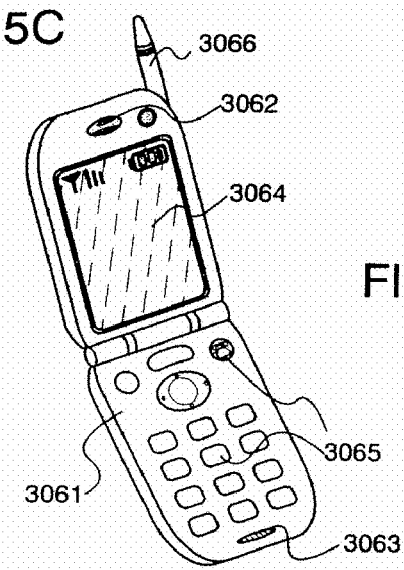

FIG. 15C shows an example of a portable telephone device equipped with the present invention, which is composed of a main body 3061, a voice output portion to 3062, a voice input portion 3063, a display portion 3064, an operation switch 3065, an antenna 3066, and the like. By applying this invention, a mobile phone with an improved picture quality of display portion 3064 can be completed.

Figure 15D:
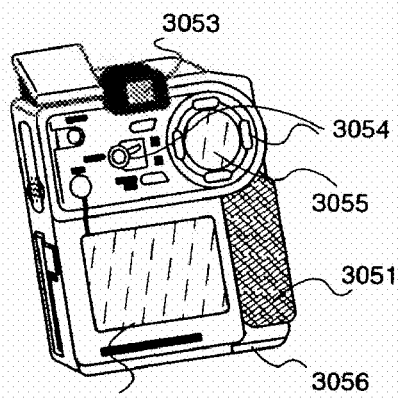

FIG. 15D shows an example of a digital camera equipped with the present invention, which is composed of a main body 3051, a display portion (A) 3052, an eyepiece portion 3053, an operation switch 3054, a display portion (B) 3055, a battery 3056, and the like. By applying this invention, a digital camera with an improved picture quality of display portion 3052 can be completed.

Figure 15E:
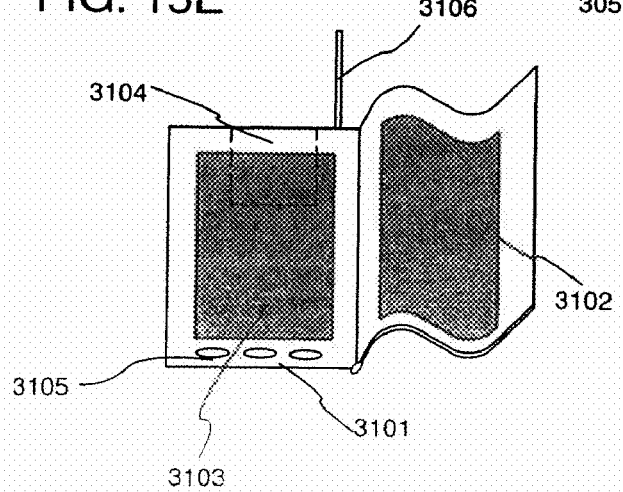

FIG. 15E shows an electronic book device which is composed of a main body 3101, a display portion (A) 3102, a display portion (B) 3103, a recording medium 3104, an operational switch 3105, an antenna 3106, and the like. By applying this invention, an electronic book device with an improved picture quality of the display portion (A) 3102 and display portion (B) 3103 can be completed. Furthermore, the device shown here is only an example and is not limited to these various uses.

In the above embodiment of the present invention, the TFT having the top gate structure is described. Even when a TFT having an inverse staggered type structure or a staggered type structure is used, the present invention can be similarly applied. In addition, the case where two current control TFTs are connected in parallel is described. The present invention is not limited to such a case and can be similar applied to the case where three or more TFTs are connected in parallel or the case where TFTs are connected in series-parallel.

Further, in the above embodiment, the display device including the light emitting element using the organic compound layer as the phosphor is described. The present invention is not limited to such a display device and can be applied to a display device including a light emitting element in which a phosphor is made of an inorganic compound, a display device including a light emitting element made from a light emitting diode, and a display device including an electron source element, and the same effect is obtained.

As described above, according to the present invention, a display device in which variation in brightness due to variation in crystallinity by laser annealing is reduced and which has a high image quality can be provided in the display device composed of the TFTs and the light emitting element. In addition, the reliability of the light emitting element can be improved by constant current drive.

What is claimed is:

1. A method of manufacturing a semiconductor device comprising:
    forming an amorphous semiconductor film over an insulating surface;
    irradiating the amorphous semiconductor film with a laser beam while scanning the laser beam in a first direction so that crystals are grown along the first direction;
    patterning the crystallized semiconductor film to form a crystallized semiconductor island;
    forming a first thin film transistor comprising a first channel region in a first region of the crystallized semiconductor island so that a channel length direction of the first channel region is the first direction;
    forming a second thin film transistor comprising a second channel region in a second region of the crystallized semiconductor island so that a channel length direction of the second channel region is different from the first direction;
    forming a capacitor comprising a third region of the crystallized semiconductor island; and
    forming a light emitting element electrically connected to the first thin film transistor and the second thin film transistor,
    wherein the first thin film transistor, the second thin film transistor and the light emitting element are formed in a pixel, and
    wherein the first region, the second region and the third region are adjacent to each other.

2. The method of manufacturing a semiconductor device according to claim 1, wherein the laser beam is a continuous oscillating laser beam.

3. The method of manufacturing a semiconductor device according to claim 1, wherein the semiconductor device further comprises a wiring connecting one of source and drain of the first thin film transistor, one of source and drain of the second thin film transistor, and a first electrode of the light emitting element.

4. The method of manufacturing a semiconductor device according to claim 1, wherein a first electrode of the light emitting element overlaps with a data line and a scan line.

5. The method of manufacturing a semiconductor device according to claim 1, wherein the semiconductor device further comprises a pixel portion comprising the pixel, a first scan line driver circuit adjacent to a first side of the pixel portion, a second scan line driver circuit adjacent to a second side of the pixel portion, and a FPC adjacent to a third side of the pixel portion.

6. A method of manufacturing a semiconductor device comprising:
   forming an amorphous semiconductor film over an insulating surface;
   irradiating the amorphous semiconductor film with a laser beam while scanning the laser beam in a first direction so that crystal grain boundaries extend along the first direction;
   patterning the crystallized semiconductor film to form a crystallized semiconductor island;
   forming a first thin film transistor comprising a first channel region in a first region of the crystallized semiconductor island so that carrier flows in a direction parallel with the first direction;
   forming a second thin film transistor comprising a second channel region in a second region of the crystallized semiconductor island so that carrier flows in a direction intersecting the first direction;
   forming a capacitor comprising a third region of the crystallized semiconductor island; and
   forming a light emitting element connecting with the first thin film transistor and the second thin film transistor,
   wherein the first thin film transistor, the second thin film transistor and the light emitting element are formed in a pixel, and
   wherein the first region the second region and the third region are adjacent to each other.

7. The method of manufacturing a semiconductor device according to claim 6, wherein the laser beam is a continuous oscillating laser beam.

8. The method of manufacturing a semiconductor device according to claim 6, wherein the semiconductor device further comprises a wiring connecting one of source and drain of the first thin film transistor, one of source and drain of the second thin film transistor, and a first electrode of the light emitting element.

9. The method of manufacturing a semiconductor device according to claim 6, wherein a first electrode of the light emitting element overlaps with a data line and a scan line.

10. The method of manufacturing a semiconductor device according to claim 6, wherein the semiconductor device further comprises a pixel portion comprising the pixel, a first scan line driver circuit adjacent to a first side of the pixel portion, a second scan line driver circuit adjacent to a second side of the pixel portion, and a FPC adjacent to a third side of the pixel portion.

11. A method of manufacturing a semiconductor device comprising:
   forming an amorphous semiconductor film over an insulating surface;
   irradiating the amorphous semiconductor film with a laser beam while scanning the laser beam in a first direction so that crystals are grown along the first direction;
   patterning the crystallized semiconductor film to form a crystallized semiconductor island;
   forming a first thin film transistor comprising a first gate electrode, and a first channel region in a first region of the crystallized semiconductor island, the first channel region having a channel length direction in the first direction;
   forming a second thin film transistor comprising a second gate electrode, and a second channel region in a second region of the crystallized semiconductor island, the second channel region having a channel length direction that is different from the first direction;
   forming a capacitor comprising a third region of the crystallized semiconductor island; and
   forming a light emitting element electrically connected with the first thin film transistor and the second thin film transistor,
   wherein the first gate electrode is over the first channel region,
   wherein the second gate electrode is over the second channel region, and
   wherein the first thin film transistor, the second thin film transistor and the light emitting element are formed in a pixel, and
   wherein the first region, the second region and the third region are adjacent to each other.

12. The method of manufacturing a semiconductor device according to claim 11, wherein the laser beam is a continuous oscillating laser beam.

13. The method of manufacturing a semiconductor device according to claim 11, wherein a first electrode of the light emitting element overlaps with a data line and a scan line.

14. The method of manufacturing a semiconductor device according to claim 11, wherein the semiconductor device further comprises a pixel portion comprising the pixel, a first scan line driver circuit adjacent to a first side of the pixel portion, a second scan line driver circuit adjacent to a second side of the pixel portion, and a FPC adjacent to a third side of the pixel portion.

* * * * *

UNITED STATES PATENT AND TRADEMARK OFFICE
CERTIFICATE OF CORRECTION

PATENT NO. : 8,207,024 B2
APPLICATION NO. : 12/696610
DATED : June 26, 2012
INVENTOR(S) : Shunpei Yamazaki and Yasuyuki Arai It is certified that error appears in the above-identified patent and that said Letters Patent is hereby corrected as shown below:

Column 3, line 60, replace "Is" with --TFTs--;

Column 8, line 16, replace "3056" with --305b--;

Column 8, line 26, replace "cart" with --can--;

Column 10, line 6, replace "1021)" with --102b--;

Column 13, line 56, before "3062" delete "to".

Signed and Sealed this
Second Day of October, 2012

David J. Kappos
*Director of the United States Patent and Trademark Office*